(12) United States Patent
Kojima et al.

(10) Patent No.: US 6,797,887 B2
(45) Date of Patent: Sep. 28, 2004

(54) GLASS TERMINAL FOR HIGH-SPEED OPTICAL COMMUNICATION

(75) Inventors: Tetsuya Kojima, Nagano (JP); Yoshihiko Nakamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/671,598

(22) Filed: Sep. 29, 2003

(65) Prior Publication Data

US 2004/0060727 A1 Apr. 1, 2004

(30) Foreign Application Priority Data

Sep. 30, 2002 (JP) ........................................ 2002-285451

(51) Int. Cl.[7] .............................................. H01B 17/26
(52) U.S. Cl. ........................ 174/152 GM; 174/50.56; 174/50.52
(58) Field of Search ...................... 174/152 GM, 50.64, 174/50.61, 50.52, 50.56, 50.6, 151, 152 R, 52.1, 52.2, 52.3, 52.6

(56) References Cited

U.S. PATENT DOCUMENTS

| | | | | |
|---|---|---|---|---|
| 5,557,074 A | * | 9/1996 | Miyamoto et al. | ... 174/152 GM |
| 5,563,562 A | * | 10/1996 | Szwec | ................. 174/152 GM |
| 6,034,424 A | * | 3/2000 | Fujimura et al. | ............ 257/696 |
| 6,509,525 B2 | * | 1/2003 | Honkomp et al. | ... 174/152 GM |
| 6,674,001 B2 | * | 1/2004 | Marlor et al. | ........ 174/152 GM |

FOREIGN PATENT DOCUMENTS

| | | | |
|---|---|---|---|
| JP | 6-29451 | | 2/1994 |
| JP | 406112342 | * | 4/1994 |
| JP | 407161868 | * | 6/1995 |

* cited by examiner

*Primary Examiner*—Dean A. Reichard
*Assistant Examiner*—Angel R. Estrada
(74) *Attorney, Agent, or Firm*—Staas & Halsey LLP

(57) ABSTRACT

A glass terminal for high-speed optical communication. The glass terminal includes an eyelet member provided with an inserting hole, a signal lead being inserted into the inserting hole and sealed with the eyelet member using glass filled in the inserting hole and an optical element mounting block fixed to the eyelet member. The optical element mounting block having such a size to cover a range where the inserting hole is arranged. The optical element mounting block is provided with a coaxial hole arranged coaxially with the inserting hole and having a diameter larger than that of the signal lead, the signal lead extending into the coaxial hole. The optical element mounting block also includes a said surface partially cut off so that an outer peripheral surface of the signal lead in the coaxial hole is partially exposed.

15 Claims, 6 Drawing Sheets

GLASS TERMINAL FOR HIGH-SPEED OPTICAL COMMUNICATION

BACKGROUND OF THE INVENTION

1. Field of the Invention

The present invention relates to a glass terminal and, more specifically, to a glass terminal used for high-speed optical communication.

2. Description of the Related Art

A lead is sealed in an metallic eyelet member with glass and a block-like optical element mounting section is uprightly mounted on the eyelet member to form a glass terminal, wherein an optical element (laser element) is mounted onto the optical element mounting section. Thus, the glass terminal is used as an optical semiconductor device by electrically connecting the lead to the optical element member. FIG. 9 illustrates a conventional glass terminal on which the optical element is mounted. In this drawing, 10 denotes an eyelet member, 12 denotes a lead which is inserted into a through-hole provided in the eyelet member 10 and sealed with glass, 14 denotes an optical element mounting section, and 16 denotes an optical element.

An optical semiconductor device in which the glass terminal is used for a communication device, using high-frequency signals, such as for optical communication. When the high-frequency signals are used, it is necessary to take the transmission characteristic of the signal into account for the purpose of matching it with a characteristic impedance of a transmission path. For this purpose, a structure of a glass terminal improved in high-frequency characteristics has been proposed. For example, as a coaxial structure having the lead as a core is formed in a portion in which the lead is inserted into the eyelet and sealed with glass, it is possible to employ a method in which the characteristic impedance is adjusted by regulating an inner diameter of the through-hole or an outer diameter of the lead in this coaxial structure portion or by covering the glass surface with a covering material having a dielectric constant different from the glass (see, for example, Japanese Unexamined Patent Publication (Kokai) No. 6-29451).

While exclusive devices have been developed in the optical semiconductor device for using high-frequency signals, they are expensive. On the contrary, a glass terminal which can be produced at a low cost is much more suitable for mass production.

In this regard, when an extremely high-frequency signal of 10 GHz is used, impedance matching becomes impossible, in the conventional glass terminal shown in FIG. 9, even if the characteristic impedance is regulated in the coaxial structure portion of the lead 12, because the lead 12 is exposed as it is on the eyelet member 10, whereby the transmission loss of the high-frequency signal is not negligible. In the glass terminal of the conventional type, while the characteristic impedance is adjustable in a range from 15 to 25Ω in a portion within the eyelet member 10, that in a portion exposed above the eyelet member 10 is approximately 200Ω.

SUMMARY OF THE INVENTION

Accordingly, the present invention has been made to solve these problems in the prior art.

Accordingly, an object thereof is to provide a glass terminal capable of improving the transmission characteristic of a high-frequency signal.

Another object of the present invention is to provide a glass terminal, which is excellent in the transmission characteristic of a high-frequency signal even in a lead portion extending above the eyelet member, as well as being easily produced in a mass-production system.

According to the present invention, there is provided a glass terminal for high-speed optical communication, the terminal comprising: an eyelet member provided with an inserting hole; an optical element mounting block fixed to the eyelet member, the optical element mounting block having such a size to cover a range where the inserting hole is arranged, the optical element mounting block being provided with a coaxial hole arranged coaxially with the inserting hole and having a diameter larger than that of the signal lead; a signal lead being inserted into the inserting hole and sealed with the eyelet member by means of glass filled in the inserting hole, the signal lead being extending into the coaxial hole; and the optical element mounting block having a side surface partially cut off so that an outer peripheral surface of the signal lead in said coaxial hole is partially exposed.

A side surface of the optical element mounting block is cut off as a tapered surface, so that an exposed area of the outer peripheral surface of the signal lead coaxial hole is gradually increased.

According to another aspect of the present invention, there is provided a glass terminal for high-speed optical communication, the terminal comprising: a metallic eyelet member having upper and lower surfaces and having a plurality of inserting holes extending substantially perpendicular to the upper and lower surfaces and spaced from each other; an optical element mounting block having a bottom surface fixed to the upper surface of the eyelet member, the bottom surface of the optical element mounting block having such a size to cover a range of the upper surface of the eyelet member where the plurality of inserting holes are arranged, the optical element mounting block being provided with coaxial holes arranged coaxially with the inserting holes, respectively, each of the coaxial holes having a diameter larger than that of the signal lead; the signal leads being sealed with the eyelet member by means of glass filled in the inserting holes, respectively, and extended into the respective coaxial hole; and the optical element mounting block having a side surface thereof partially cut off so that an outer peripheral surface of each of the signal leads is partially exposed.

In this case also, a side surface of the optical element mounting block is cut off as a tapered surface, so that an exposed area of the outer peripheral surface of each of the signal leads in the respective coaxial hole is gradually increased.

According to a still another object of the present invention there is provided an optical element comprises an above-mentioned glass terminal and further comprising: a substrate mounted on a surface of the optical element mounting block perpendicular to the bottom surface; and an optical element mounted on the substrate so that the optically element is electrically connected with the exposed portion of the signal leads.

The optical element mounted on the substrate is electrically connected with the exposed portion of the signal leads by means of wire-bonding.

DETAILED DESCRIPTION OF THE PREFERRED EMBODIMENTS

The present invention will be described in more detail below based on the preferred embodiment with reference to the attached drawings.

Figure 1:
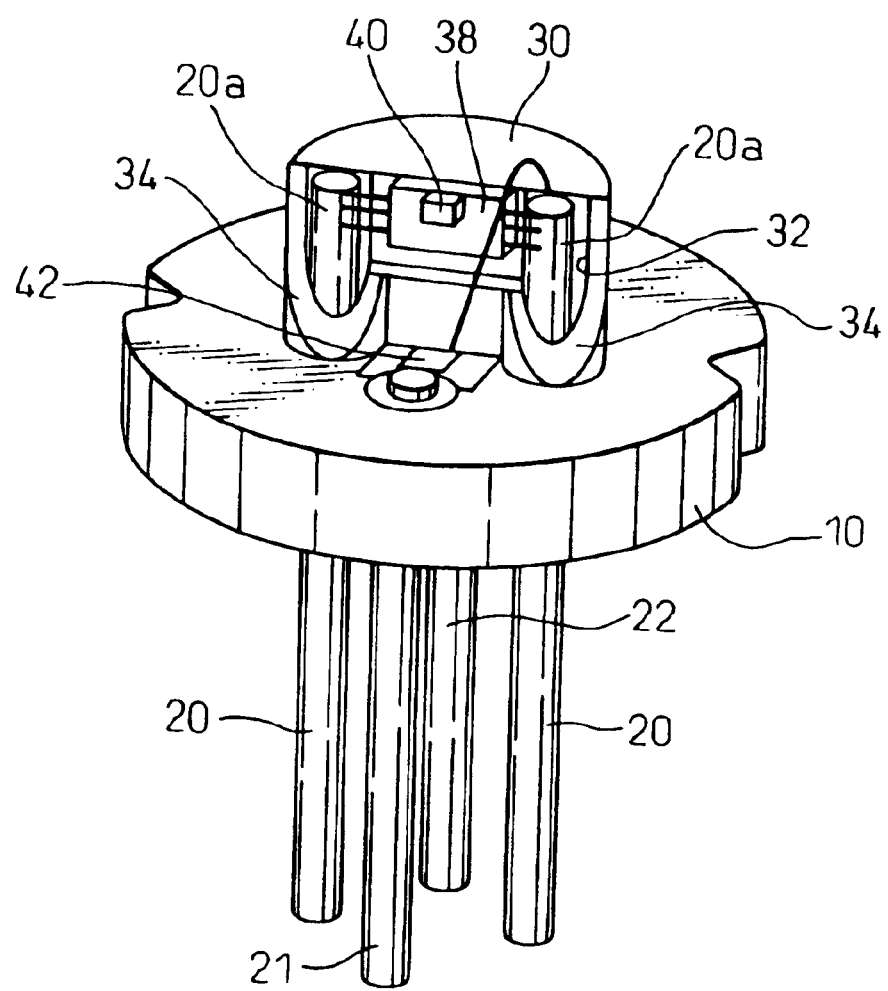
FIG. 1 is a perspective view of an optical semiconductor device provided with a glass terminal of this invention on which an optical element is mounted.

FIG. 1 is a perspective view of one embodiment of the inventive glass terminal. In this drawing, an optical element is mounted on the glass terminal.

Reference numeral 10 denotes an eyelet member; 20 denotes a signal lead; 21 denotes a monitor lead; and 22 denotes a ground lead. The signal lead 20 and the monitor lead 21 are sealed with glass in an air-tight manner, and the ground lead 22 is brazed to a lower surface of the eyelet member 10.

Reference numeral 30 denotes an optical element mounting section formed separately from the eyelet member 10 by a thermal-conductive material such as copper and bonded to the upper surface of the eyelet member 10. As illustrated, the optical element mounting section 30 is of a block shape to facilitate the heat dissipation from the optical element. In this regard, it is also possible to form the optical element mounting section 30 not only separately from the eyelet member 10 but also as one piece with the eyelet member 10.

The characteristic structure of the glass terminal according to this embodiment is that a bonding area, in which the optical element mounting section 30 is bonded to the upper surface of the eyelet member 10, is provided to include a region in which the inserting hole for inserting the signal lead 20 is arranged, a coaxial hole 32 for passing the signal lead 20 therethrough is provided in the optical element mounting section 30, and the signal lead 20 is inserted into the inserting hole of the eyelet member 10 and also into the coaxial hole 32.

Figure 2:
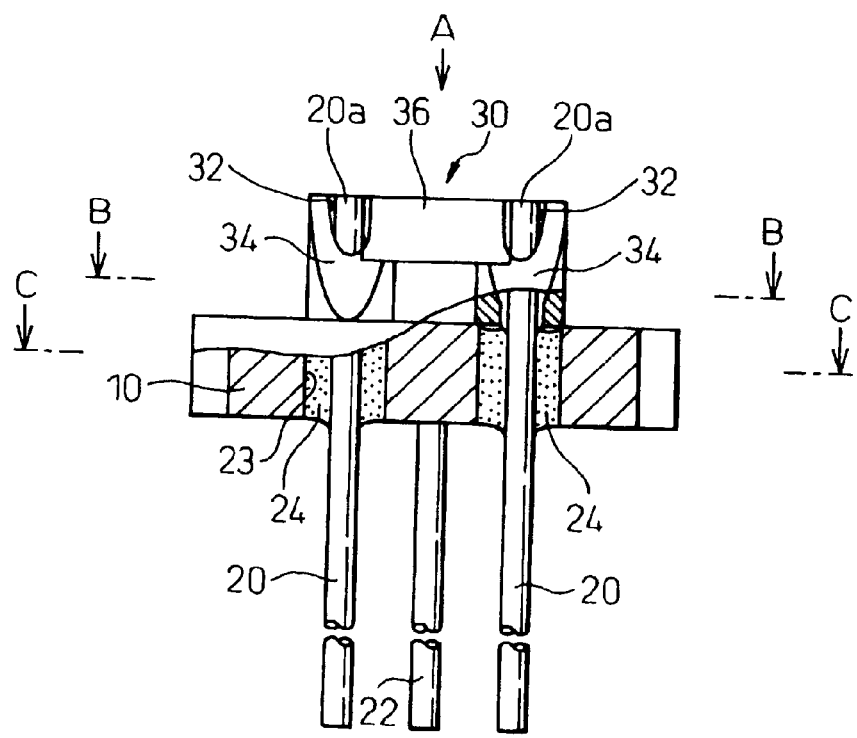
FIG. 2 is a front sectional view of one embodiment of the glass terminal.
Figure 3A:
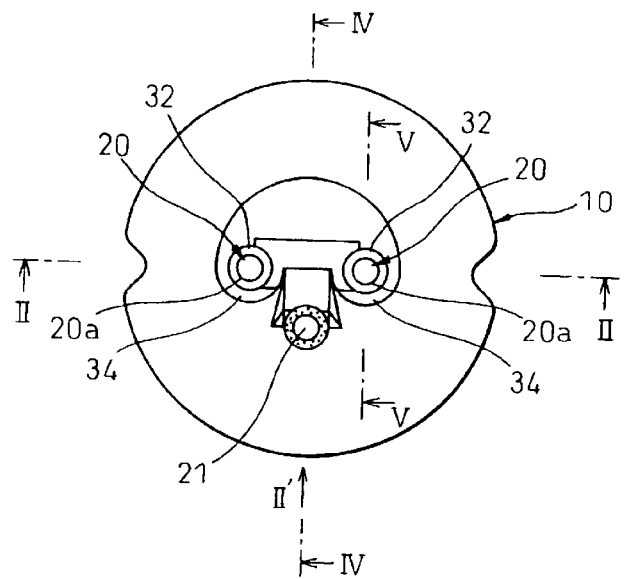
FIG. 3(A) is a plan view seen from a arrow A in FIG. 2, and FIGS. 3(B) and 3(C) are cross-sectional views taken along line B—B and C—C, respectively.
Figure 3B:
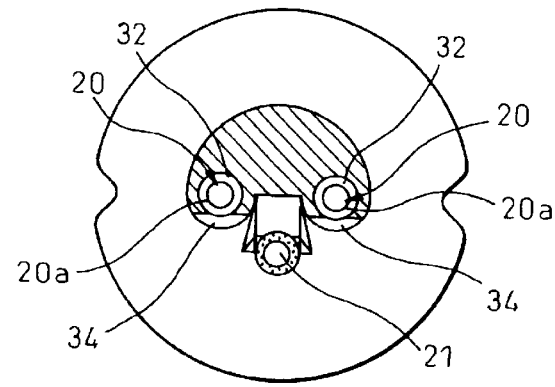
Figure 3C:
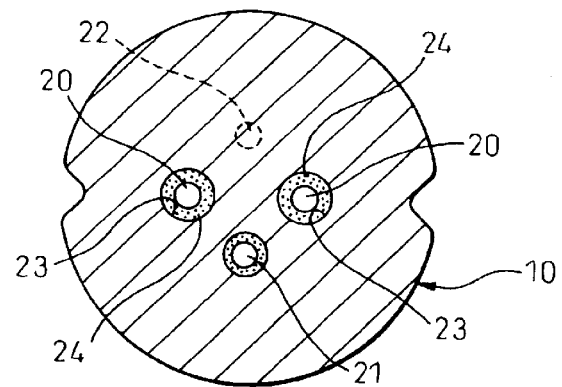

FIG. 2 is a front sectional view in which the signal lead 20 is sealed in an air-tight manner with glass in the inserting hole 23 provided in the eyelet member 10 and attached to the optical element mounting section 30 through the coaxial hole 23 provided therein. The signal lead 20 passes through the inserting hole 23 and the coaxial hole 32 and is sealed so that an upper end thereof is flush with the upper surface of the optical element mounting section 30.

Reference numeral 24 denotes glass used for sealing the signal lead 20 in the inserting hole 23 in an air-tight manner. In this embodiment, all of the signal lead 20, the monitor lead 21 and the ground lead 22 are made of iron-cobalt-nickel alloy, and the glass is soft glass.

The inserting holes 23 for inserting the signal leads 20 are provided at symmetrical positions on left and right sides of a center line of the eyelet member 10, and the coaxial holes 32 are provided coaxial with the respective inserting holes.

An inner diameter of the coaxial hole 32 is somewhat larger than an outer diameter of the signal lead 20 so that a some space remains between the outer circumference of the extension 20a of the signal lead 20 extending upward from the inserting hole 23 of the eyelet member 10 and the inner circumference of the coaxial hole 32.

That is, a range in which the signal lead 20 is sealed in an air-tight manner in the eyelet member 10 is limited to the inserting hole 23, and the glass 24 does not enter the coaxial hole 32 except for a meniscus of glass 24.

Figure 4:
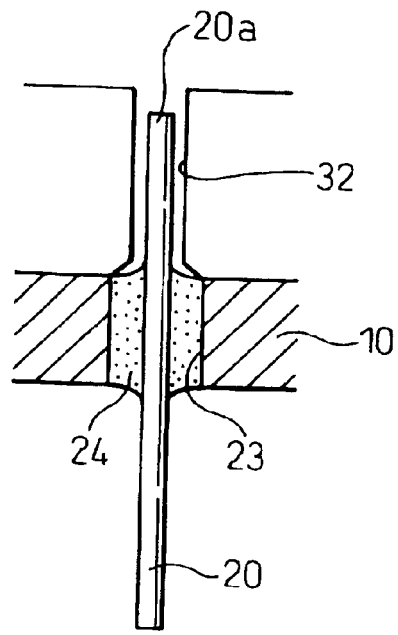
FIG. 4 is a sectional view illustrating the arrangement of a signal lead, a coaxial hole and an inserting hole.

FIG. 4 illustrates the arrangement of the coaxial hole 32 and the signal lead 20, and the cross-sectional arrangement of the signal lead 20, the inserting hole 23 and the glass 24. As the coaxial hole 32 is formed to have a diameter smaller than that of the inserting hole 23, an inner surface of a portion of the coaxial hole 32 coupled to the inserting hole 23 is tapered. The glass 24 adhering to the signal lead 20 in a meniscus manner does not adhere to the inner surface (tapered surface) of the coaxial hole 32.

Figure 5:
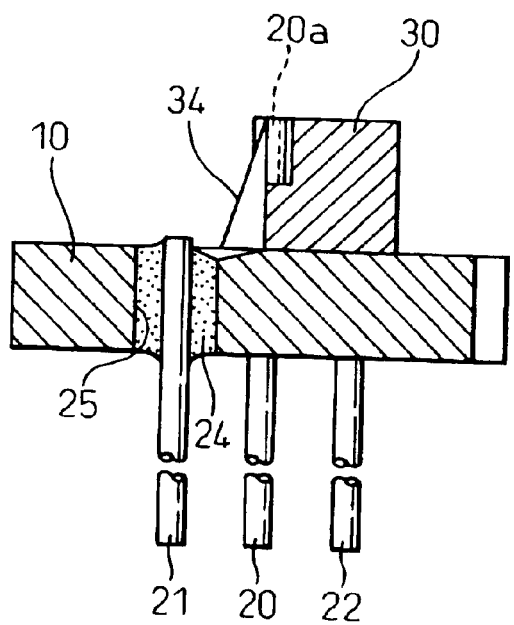
FIG. 5 is a side sectional view of the embodiment of the glass terminal.

FIG. 5 illustrates a side sectional view in which the signal lead 20, the monitor lead 21 and the ground lead 22 are attached to the eyelet member 10. Reference numeral 25 denotes an inserting hole for inserting the monitor lead 21. The monitor lead 21 is sealed with the glass 24 to the inserting hole 25 so that an upper end surface thereof is flush with the upper surface of the eyelet member 10.

The extension 20a of the signal lead 20 projected above the eyelet member 10 is provided to pass through the coaxial hole 32 in the optical element mounting section 30. As shown in FIG. 5, a lateral surface of the optical element mounting section 30 in which the coaxial hole 32 is formed is a tapered surface 34 so that an upper portion of the coaxial hole 32 is partially exposed outside. Thereby, part of the outer circumference of a portion of the signal lead 20 inserted into the coaxial hole 32 is exposed from the coaxial hole 32. The exposed lateral surface of the upper portion of the signal lead 20 becomes a wire-bonding section.

Figure 6:
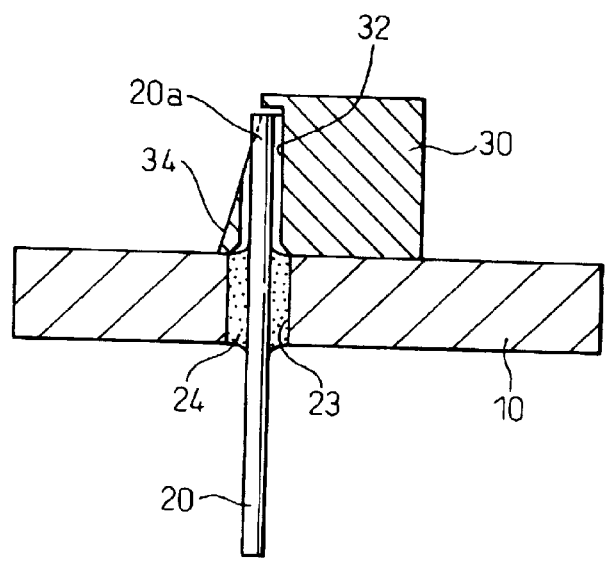
FIG. 6 is an illustration of the arrangement of a signal lead and a coaxial hole.

FIG. 6 illustrates the arrangement of the coaxial hole 32 provided in the optical element mounting section 30 and the signal lead 20 in an enlarged scale. The reason why the lateral surface of the optical element mounting section 30 on which the coaxial hole 32 is formed in a tapered form is in that it is required that a proximal end portion of the signal lead 20 inserted into the coaxial hole 32 is completely encircled by the coaxial hole 32 but the distal end portion thereof is gradually exposed outside.

In a portion of the signal lead 20 coaxial with the coaxial hole 32, the signal lead 20 is encircled with an electro-conductor to have a predetermined characteristic impedance, which is made close to an impedance value in the wire-bonding section by gradually widening the opening portion of the signal lead 20. This is because it is necessary to expose the wire-bonding section, and to gradually change the impedance value. Preferably, an upper end surface of the signal lead 20 is not completely exposed outside the optical element mounting section 30.

Figure 7:
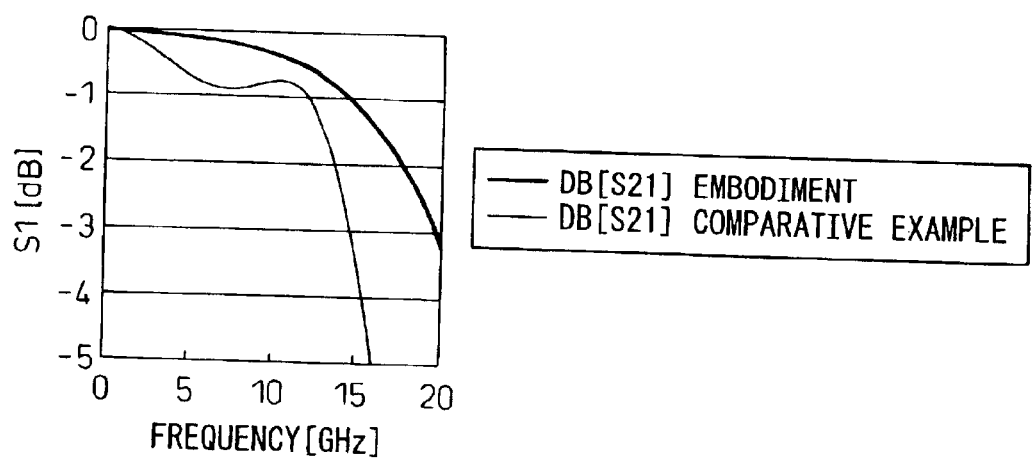
FIG. 7 is a graph representing the high-frequency characteristic (input signal-output signal) in the embodiment of the glass terminal.
Figure 8:
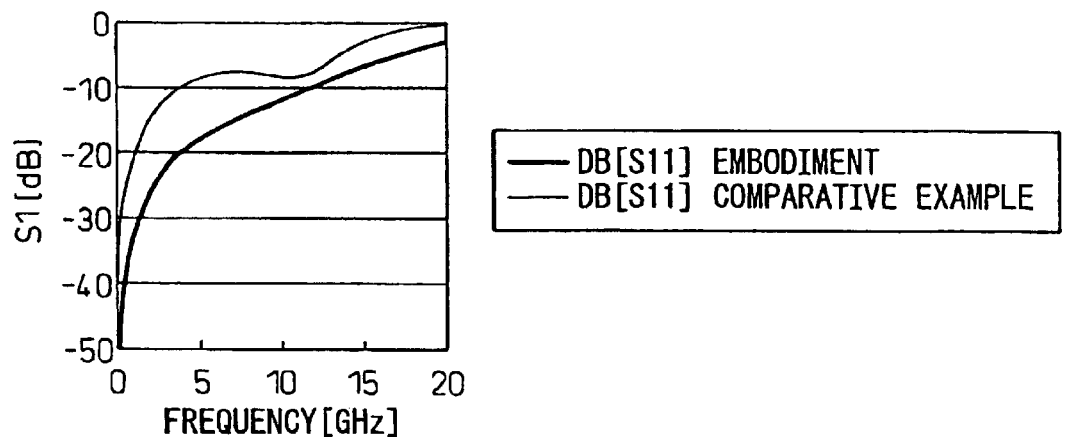
FIG. 8 is a graph representing the high-frequency characteristic (input signal-input side reflection signal-output signal) in the embodiment of the glass terminal.
Figure 9:
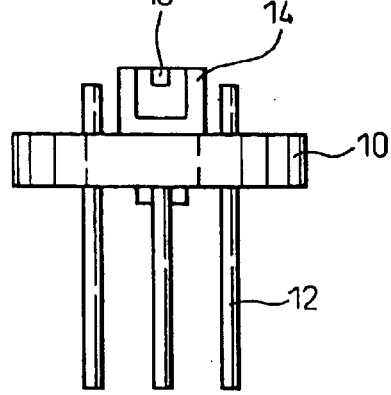
FIG. 9 is a front view of the conventional glass terminal.

FIGS. 7 and 8 illustrate simulated results of the transmission characteristic of the glass terminal for a high-frequency signal. FIG. 7 is a frequency characteristic of the output signal relative to the input signal, and FIG. 8 is a frequency characteristic of the reflected signal on the input side relative to the input signal. According to the glass terminal of this embodiment, it is apparent that an output increases in comparison with the conventional glass terminal (Comparative example) as shown in FIG. 7, and the transmission characteristic is improved as the reflection of the input signal is restricted as shown in FIG. 8.

When the optical element is mounted to the glass terminal, as shown in FIG. 1, a substrate 38 is bonded to a support surface 36 of formed as a surface vertical to the upper surface of the eyelet member 10, and is connected to the respective signal leads 20 by the wire-bonding. Then, an optical element 40 mounted to the substrate 38 is connected to a circuit formed on the substrate 30 by the wire-bonding.

A monitor element 42 is mounted in a recess formed on the upper surface of the eyelet member 10, and connected to an upper end surface of the monitor lead 21 and an upper end surface of the signal lead 20 by wire-bonding.

According to the present invention, as described above, it is possible to suitably adjust the characteristic impedance at a position at which the signal lead is inserted into the coaxial hole by regulating a length of the signal lead exposed from the coaxial hole, and thus to provide the glass terminal excellent in high-frequency characteristic. Also, by forming the lateral surface of the optical element mounting section defining the outer surface of the coaxial hole in a cut-off shape having a tapered surface, it is possible to gradually increase an exposed portion of the distal end of the signal lead inserted into the coaxial hole, and to gradually vary the characteristic impedance value in this coaxial structure portion in the direction of the transmission path of the signal lead. Thus, a glass terminal improved in transmission characteristics for a high-frequency signal is provided.

It should be understood by those skilled in the art that the foregoing description relates to only a preferred embodiment of the disclosed invention, and that various changes and modifications may be made to the invention without departing the sprit and scope thereof.

What is claimed is:

1. A glass terminal for high-speed optical communication, said glass terminal comprising:
   an eyelet member provided with an inserting hole;
   a signal lead being inserted into said inserting hole and sealed with said eyelet member by glass filled in said inserting hole;
   an optical element mounting block fixed to said eyelet member, said optical element mounting block having such a size to cover a range where said inserting hole is arranged, said optical element mounting block being provided with a coaxial hole arranged coaxially with said inserting hole and having a diameter larger than that of said signal lead, said signal lead extending into said coaxial hole;
   said optical element mounting block having a side surface partially cut off so that an outer peripheral surface of the signal lead in said coaxial hole is partially exposed.

2. A glass terminal as set forth in claim 1, wherein said side surface of the optical element mounting block is cut off as a tapered surface, so that an exposed area of the outer peripheral surface of the signal lead coaxial hole is gradually increased.

3. A glass terminal for high-speed optical communication, said glass terminal comprising:
   a metallic eyelet member having upper and lower surfaces and having a plurality of inserting holes extending substantially perpendicular to said upper and lower surfaces and spaced to each other;
   signal leads being sealed to said eyelet member by glass filled in said inserting holes, respectively;
   an optical element mounting block having a bottom surface fixed to said upper surface of the eyelet member, said bottom surface of the optical element mounting block having such a size to cover a range of the upper surface the eyelet member where said plurality of inserting holes are arranged, said optical mounting block being provided with coaxial holes arranged coaxially with said inserting holes, respectively, each of said coaxial holes having a diameter larger than that of said signal leads, said signal leads extending into said respective coaxial hole;
   said optical element mounting block having a side surface thereof partially cut off so that an outer peripheral surface of each of the signal leads is partially exposed.

4. A glass terminal as set forth in claim 3, wherein a side surface of the optical element mounting block is cut off as a tapered surface, so that an exposed area of the outer peripheral surface of each of the signal leads in the respective coaxial hole is gradually increased.

5. An optical element comprising:
   a glass terminal comprising:
   a metallic eyelet member having upper and lower surfaces and having a plurality of inserting holes extending substantially perpendicular to said upper and lower surfaces and spaced to each other;
   signal leads being sealed with said eyelet member by glass filled in said inserting holes, respectively;
   an optical element mounting block having a bottom surface fixed to said upper surface of the eyelet member, said bottom surface of the optical element mounting block having such a size to cover a range of the upper surface of the eyelet member where said plurality of inserting holes are arranged, said optical element mounting block being provided with coaxial holes arranged coaxially with said inserting holes, respectively, each of said coaxial holes having a diameter larger than that of said signal leads, said signal leads extended into said respective coaxial hole;
   said optical element mounting block having a side surface thereof partially cut off so that an outer peripheral surface of each of the signal leads is partially exposed;
   a substrate mounted on a surface of said optical element mounting block perpendicular to said bottom surface; and
   an optical element mounted on said substrate so that said optical element is electrically connected with said exposed portion of said signal leads.

6. An optical element as set forth in claim 5, wherein said optical element mounted on said substrate is electrically connected with said exposed portion of said signal leads by means of wire-bonding.

7. A glass terminal for optical communication, the glass terminal comprising:
   an eyelet member having an insertion hole therein;
   a signal lead being inserted into the insertion hole and sealed with the eyelet member; and
   an optical element mounting block having a coaxial hole arranged coaxially with the insertion hole, wherein a diameter of the coaxial hole is larger than a diameter of the signal lead and the signal lead extends into the coaxial hole,
   wherein the optical element mounting block is formed of a same piece with the eyelet member, and a side surface of the optical element mounting block is partially cut-off to partially expose an outer surface of the signal lead.

8. The glass terminal of claim 7, wherein an inner diameter of the coaxial hole is larger than an outer diameter of the signal lead so that there is a space between an outer circumference of an extension of the signal lead extending upward from the insertion hole and an inner circumference of the coaxial hole.

9. The glass terminal of claim 7, wherein the side surface of the optical element mounting block comprises a tapered surface, wherein an upper portion of the coaxial hole is partially exposed and the signal lead extended into the coaxial hole is partially exposed.

10. A glass terminal for optical communication, the glass terminal comprising:

an eyelet member having an insertion hole therein;

a signal lead to be inserted into the insertion hole and sealed with the eyelet member by means of glass filled in the insertion hole; and an optical element mounting block having a coaxial hole formed of a tapered shape, wherein the signal lead extends into the coaxial hole, and a proximal end portion of the signal lead is encircled by the coaxial hole and a distal end portion thereof is exposed to an outside of the optical element mounting block.

11. An optical element comprising:

a glass terminal comprising:

an eyelet member having upper and lower surfaces and a plurality of insertion holes perpendicular to the upper and lower surfaces and spaced apart from each other;

a plurality of signal leads to be inserted into the insertion holes and sealed by means of glass filled in the insertion holes;

an optical element mounting block having a plurality of coaxial holes arranged coaxially with the insertion holes and the coaxial holes comprising slanted surfaces thereon, wherein the signal leads extend upward through the coaxial holes and proximal ends of the signal leads are encircled by the coaxial holes and distal ends of the signal leads are partially exposed to an outside of the optical element mounting block;

a substrate mounted on a surface of the optical element mounting block perpendicular and spaced apart from a bottom surface of the optical element mounting block; and an optical element mounted on the substrate and electrically connected with a portion of the signal leads partially exposed to the outside of the optical element mounting block.

12. A glass terminal for optical communication, the glass terminal comprising:

an eyelet member having an insertion hole therein;

a signal lead being inserted into the insertion hole and sealed with the eyelet member;

an optical signal which travels through the glass terminal; and an optical element mounting block having a coaxial hole arranged coaxially with the insertion hole, wherein a diameter of the coaxial hole is larger than a diameter of the signal lead and the signal lead extends into the coaxial hole, wherein the optical element mounting block is formed of a same piece with the eyelet member, and a side surface of the optical element mounting block is partially cut-off to partially expose an outer surface of the signal lead.

13. The glass terminal of claim 12, wherein an inner diameter of the coaxial hole is larger than an outer diameter of the signal lead so that there is a space between an outer circumference of an extension of the signal lead extending upward from the insertion hole and an inner circumference of the coaxial hole.

14. The glass terminal of claim 12, wherein the side surface of the optical element mounting block comprises a tapered surface, wherein an upper portion of the coaxial hole is partially exposed and the signal lead extended into the coaxial hole is partially exposed.

15. A glass terminal for optical communication, the glass terminal comprising:

an eyelet member having an insertion hole therein;

a signal lead to be inserted into the insertion hole and sealed with the eyelet member by means of glass filled in the insertion hole;

an optical signal which travels through the glass terminal; and an optical element mounting block having a coaxial hole formed of a tapered shape, wherein the signal lead extends into the coaxial hole, and a proximal end portion of the signal lead is encircled by the coaxial hole and a distal end portion thereof is exposed to an outside of the optical element mounting block.

* * * * *

UNITED STATES PATENT AND TRADEMARK OFFICE
CERTIFICATE OF CORRECTION

PATENT NO. : 6,797,887 B2
DATED : September 28, 2004
INVENTOR(S) : Tetsuya Kojima et al.

It is certified that error appears in the above-identified patent and that said Letters Patent is hereby corrected as shown below:

Title page,
Item [57], ABSTRACT,
Line 12, change "said" to -- side --.

Signed and Sealed this

Twenty-sixth Day of April, 2005

JON W. DUDAS
*Director of the United States Patent and Trademark Office*